United States Patent
Mortun (10) Patent No.: US 9,941,604 B2
(45) Date of Patent: Apr. 10, 2018

(54) ELECTRIC RECEPTACLE HAVING A MOUNTING STRAP AND A PLURALITY OF TERMINAL OPENINGS

(71) Applicant: Hubbell Incorporated, Shelton, CT (US)

(72) Inventor: Sorin Mortun, Irvington, NY (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 15/211,374

(22) Filed: Jul. 15, 2016

(65) Prior Publication Data

US 2017/0018896 A1 Jan. 19, 2017

Related U.S. Application Data

(60) Provisional application No. 62/193,048, filed on Jul. 15, 2015.

(51) Int. Cl.
| | | |
|---|---|---|
| *H01R 13/60* | (2006.01) | |
| *H01R 13/66* | (2006.01) | |
| *H01R 4/30* | (2006.01) | |
| *H01R 13/506* | (2006.01) | |
| *H01R 13/518* | (2006.01) | |
| *H01R 27/02* | (2006.01) | |
| *H05K 5/02* | (2006.01) | |
| *H02G 3/08* | (2006.01) | |

(52) U.S. Cl.
CPC ............ *H01R 4/30* (2013.01); *H01R 13/506* (2013.01); *H01R 13/518* (2013.01); *H01R 27/02* (2013.01); *H05K 5/0278* (2013.01); *H05K 5/0286* (2013.01); *H02G 3/08* (2013.01)

(58) Field of Classification Search
CPC .. H01R 13/6395; H01R 24/525; H01R 24/78; H01R 25/006
USPC .................................... 439/535, 107; 174/53
See application file for complete search history.

(56) References Cited

U.S. PATENT DOCUMENTS

| | | | | |
|---|---|---|---|---|
| 2,705,785 A | * | 4/1955 | Benander | ............... H01R 24/76 362/119 |
| 2,969,518 A | * | 1/1961 | Slater | .................. H01R 25/006 439/516 |
| 3,489,985 A | * | 1/1970 | Martin | ................. H01R 4/4818 439/438 |

(Continued)

OTHER PUBLICATIONS

PCT/US2016/042485 International Search Report and Written Opinion dated Oct. 7, 2016 (15 pages).

*Primary Examiner* — Hae Moon Hyeon
(74) *Attorney, Agent, or Firm* — Michael Best & Friedrich, LLP (57) ABSTRACT

An electric receptacle includes a housing having a front surface including a socket opening, a back surface opposite the front surface, a first outer edge, and a second outer edge. A neutral terminal is at least partially retained in the housing. A phase terminal is at least partially retained in the housing. A first neutral opening faces the first outer edge and is in communication with the neutral terminal. A second neutral opening faces the back surface and is in communication with the neutral terminal. A first phase opening faces the second outer edge and is in communication with the phase terminal. A second phase opening faces the back surface and is in communication with the phase terminal. A mounting strap can be snap-fit to the housing.

19 Claims, 8 Drawing Sheets

(56) References Cited

U.S. PATENT DOCUMENTS

| | | | | |
|---|---|---|---|---|
| 3,671,925 | A * | 6/1972 | Drapkin | H01R 24/76 |
| | | | | 439/439 |
| 4,223,971 | A * | 9/1980 | Dola | H01R 4/2433 |
| | | | | 439/395 |
| 6,109,937 | A * | 8/2000 | Bonilla | H01R 13/652 |
| | | | | 439/107 |
| 6,309,248 | B1 * | 10/2001 | King | H01R 13/7135 |
| | | | | 361/42 |
| 6,617,511 | B2 * | 9/2003 | Schultz | H01R 24/70 |
| | | | | 174/50 |
| 6,814,611 | B1 * | 11/2004 | Torres | H01R 13/68 |
| | | | | 439/535 |
| 7,749,019 | B2 * | 7/2010 | Valentin | H01R 13/506 |
| | | | | 439/107 |
| 8,029,290 | B2 * | 10/2011 | Johnson | F24F 13/00 |
| | | | | 174/50 |
| 8,353,716 | B2 * | 1/2013 | Keswani | H01R 4/4818 |
| | | | | 439/355 |
| 8,758,031 | B2 * | 6/2014 | Cheng | H05K 5/02 |
| | | | | 439/107 |
| 2009/0149062 | A1 | 6/2009 | Valentin et al. | |
| 2009/0008120 | A1 | 11/2009 | Gates et al. | |
| 2010/0330826 | A1 * | 12/2010 | Phillips | H01R 31/06 |
| | | | | 439/101 |
| 2013/0280956 | A1 | 10/2013 | Cheng et al. | |
| 2015/0038006 | A1 * | 2/2015 | Jansen | H02J 7/0021 |
| | | | | 439/535 |

\* cited by examiner

ELECTRIC RECEPTACLE HAVING A MOUNTING STRAP AND A PLURALITY OF TERMINAL OPENINGS

RELATED APPLICATION(S)

This application is based on U.S. provisional application Ser. No. 62/193,048, filed Jul. 15, 2015, the disclosure of which is incorporated herein by reference in its entirety and to which priority is claimed.

FIELD

Various exemplary embodiments relate to electrical outlets or receptacles.

BACKGROUND

Wall outlets devices that provide power to electronic devices using a power socket connected to a main power supply. In the United States, standard wall outlets generally provide power via a two or three pronged socket or other alternative socket such as a universal serial bus (USB) port.

Conventional electrical outlets have two-piece housings formed by separate front and back covers that are connected by screws. A mounting strap with flanges at opposite ends generally extends between the front and back covers and allows the housing to be attached to a suitable structure, such as a building wall or an electrical box. In some electrical receptacle designs, the mounting strap has a generally U-shape so as to wrap around portions of the front and back covers of the housing. In other electrical receptacle designs, the mounting strap is a relatively flat shape and is disposed between the front and back covers of the housing. The strap is coupled to the housing using mechanical fasteners, such as screws or rivets.

In many conventional receptacle housings, the two-piece housing is coupled together using fasteners or screws, as described above. This fastener type housing forms a rigidly secured, hard to separate housing, but is cumbersome and difficult to assemble.

SUMMARY

According to an exemplary embodiment, an electric receptacle includes a housing having a front surface including a socket opening, a back surface opposite the front surface, a first outer edge, and a second outer edge. A neutral terminal is at least partially retained in the housing. A phase terminal is at least partially retained in the housing. A first neutral opening faces the first outer edge and is in communication with the neutral terminal. A second neutral opening faces the back surface and is in communication with the neutral terminal. A first phase opening faces the second outer edge and is in communication with the phase terminal. A second phase opening faces the back surface and is in communication with the phase terminal.

According to another exemplary embodiment, an electric receptacle includes a housing and a mounting strap. The housing includes a base and a cover connected to the base. The cover has a first socket positioned in a front surface, a first slot positioned in a top edge, and a second slot positioned in a bottom edge. A neutral terminal is at least partially retained in the housing. A phase terminal at least partially retained in the housing. The mounting strap includes a back portion, a first end portion extending from the back portion, a second end portion extending from the back portion opposite the first end portion, a top flange extending from the first end portion, a bottom flange extending from the second end portion, a first tab extending from the first end portion into the first slot and a second tab extending from the second end portion into the second slot.

According to another exemplary embodiment, an electric receptacle includes a housing having a front surface including a socket opening, a back surface opposite the front surface, a first slot positioned in a top edge, and a second slot positioned in a bottom edge. A neutral terminal is at least partially retained in the housing. A phase terminal is at least partially retained in the housing. A first neutral opening faces the first outer edge and is in communication with the neutral terminal. A second neutral opening faces the back surface and is in communication with the neutral terminal. A first phase opening faces the second outer edge and is in communication with the phase terminal. A second phase opening faces the back surface and is in communication with the phase terminal. A mounting strap is snap-fit to the housing. The mounting strap includes a back portion, a first end portion extending from the back portion, a second end portion extending from the back portion opposite the first end portion, a top flange extending from the first end portion, a bottom flange extending from the second end portion, a first tab extending from the first end portion into the first slot and a second tab extending from the second end portion into the second slot.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Various exemplary embodiments are directed to features that can be used with electric devices, for example electric receptacles. There are various types of receptacles and related devices present in the marketplace and known to those of ordinary skill in the art. The exemplary embodiments are presented herein as a single-gang, USB outlet, although they may be incorporated into any type of receptacle, including ground fault current interrupter ("GFCI") type receptacles, or other electrical devices.

According to exemplary embodiments, a receptacle includes a housing 10. The housing 10 has a front surface 12, a back surface 14, and one or more outer edges, for example a top edge 16, a bottom edge 18, and a pair of side edges 20. In an exemplary embodiment the housing includes a base 22 and a cover 24. The cover 24 is snap-fit to the base 22, although other suitable connections, including fasteners, can be used. The housing 10 at least partially encloses various components, which are not shown for the sake of clarity and will differ depending on the type of receptacle as would be understood by one of ordinary skill in the art. The cover 24 includes one or more openings providing access to a socket. In the exemplary embodiments shown, the cover 24 provides access to a pair of USB sockets 26. Various alternative embodiments can utilize different or additional sockets 26, including two or three-prong sockets, or other residential or commercial sockets.

Figure 1:
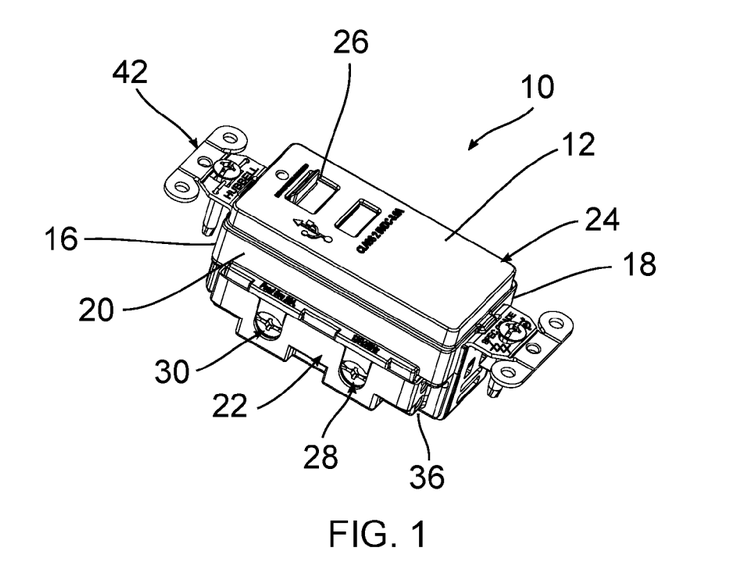
FIG. 1 is a perspective view of an exemplary receptacle.
Figure 2:
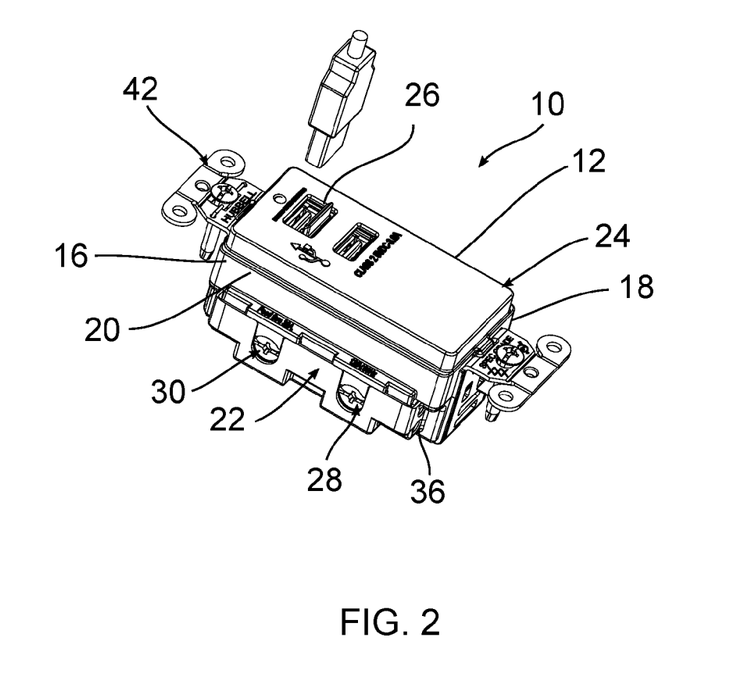
FIG. 2 is a perspective view of the receptacle of FIG. 1 and a plug.
Figure 3:
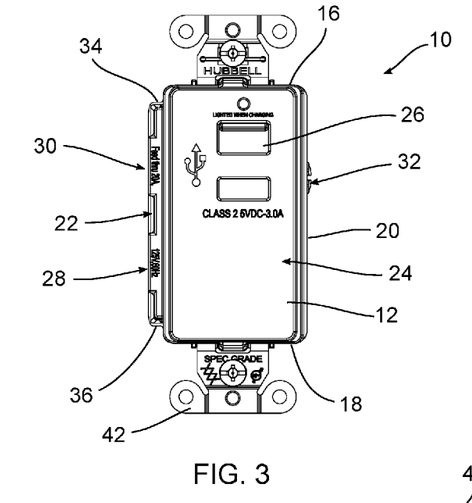
FIG. 3 is a front view of the receptacle of FIG. 1.
Figure 4:
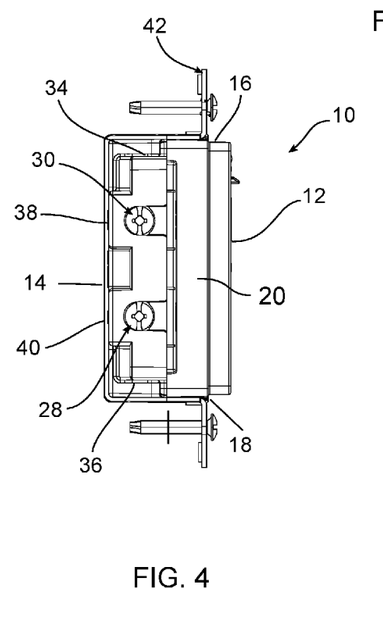
FIG. 4 is a left side view of the receptacle of FIG. 1.
Figure 5:
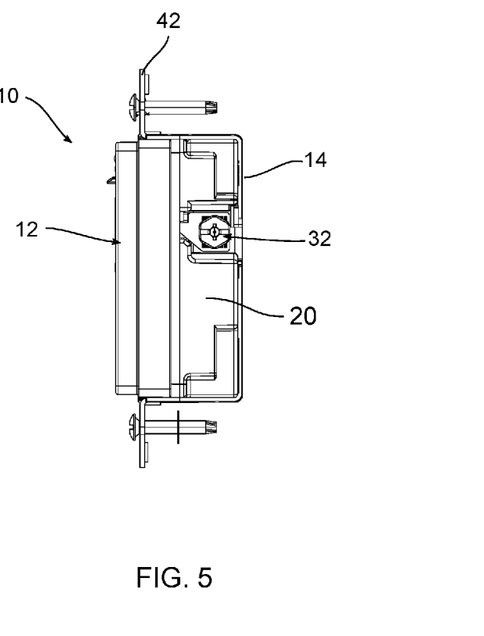
FIG. 5 is a right side view of the receptacle of FIG. 1.

The housing 10 includes a plurality of terminals for connecting electrical conductors. The terminals include a phase (hot) terminal 28, a neutral (white) terminal 30, and a ground terminal 32. As best shown in FIGS. 4 and 5, the phase and neutral terminals 28, 30 are located on a first side of the housing 10 and the ground terminal 32 is located on a second, opposite side of the housing 10. The position of the terminals, however, may vary. Each terminal includes a screw for securing a conductor to the terminal. The terminals can also include a clamp or plate that is moved by the screws to secure or release the conductors. An example of a clamp 33 is shown for the ground terminal 32 in FIG. 11.

Figure 6:
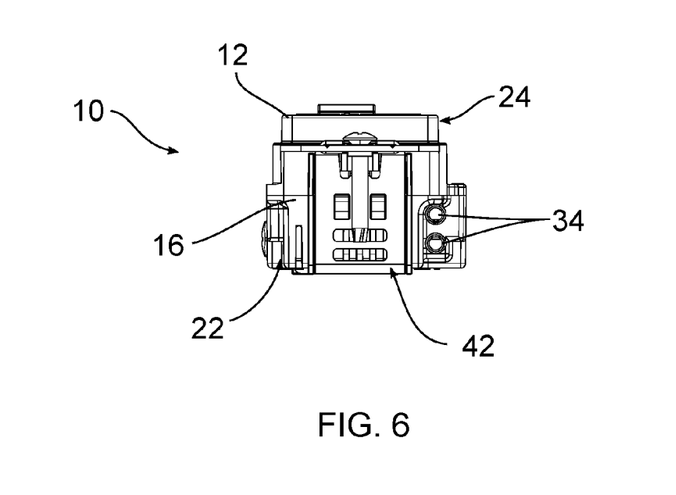
FIG. 6 is a top view of the receptacle of FIG. 1.
Figure 7:
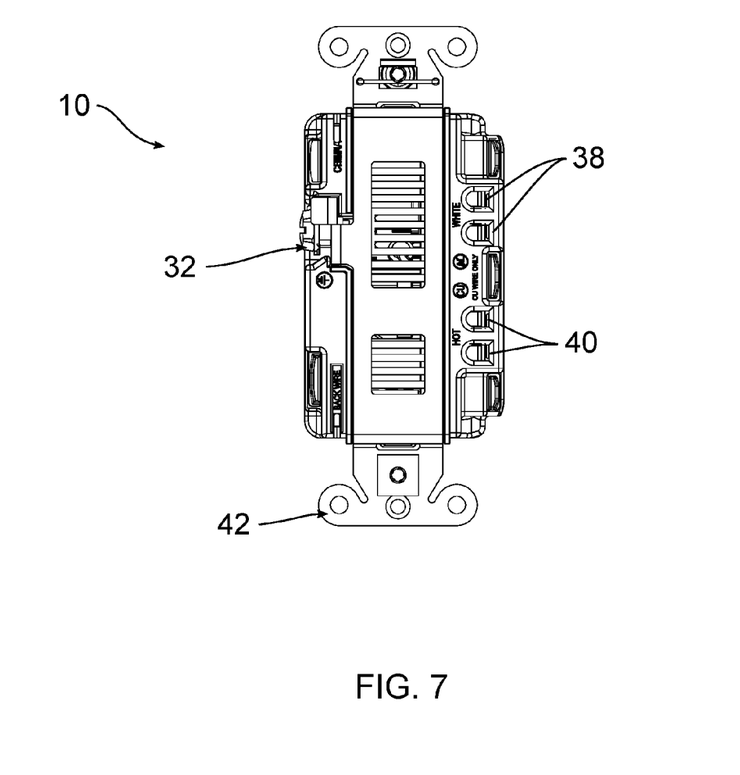
FIG. 7 is a back view of the receptacle of FIG. 1.
Figure 8:
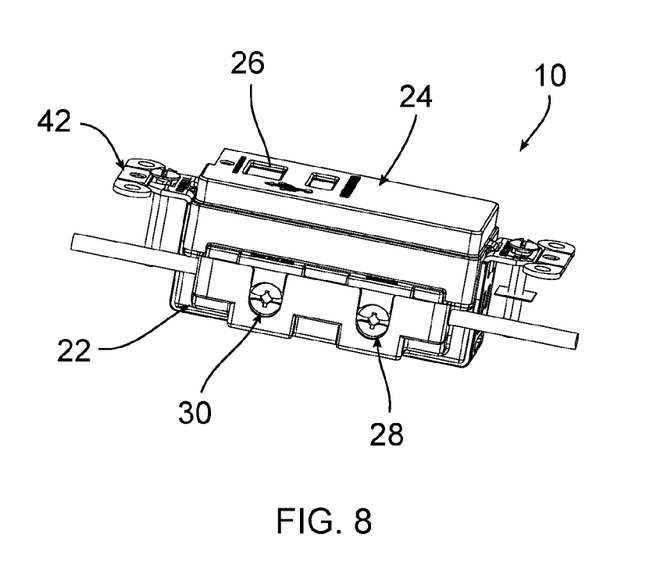
FIG. 8 is a perspective view of the receptacle of FIG. 1 with conductors attached in a first exemplary configuration.

As best shown in FIGS. 6-10, the base 22 includes a number of connection features for receiving and electrically connecting conductors to the receptacle. In an exemplary embodiment the connection features include one or more apertures extending into the housing 10 to connect, for example physically and/or electrically, the conductors to a respective terminal. FIG. 6 shows a first pair of neutral apertures 34 for connecting conductors to the neutral terminal 30. The first pair of neutral apertures 34 face an outer edge of the housing 10, for example the top edge 16. Conductors connected to the first pair of neutral apertures 34 will extend in a direction along the height of the housing 10, as best shown in FIG. 8. The first pair of neutral apertures 34 can receive a line and/or a load conductor. The other side of the housing 10 includes a similar first pair of phase apertures 36. In various alternative embodiments a single first neutral aperture 34 and first phase aperture 36 can extend into the housing and one or more apertures facing this direction may be omitted.

Figure 9:
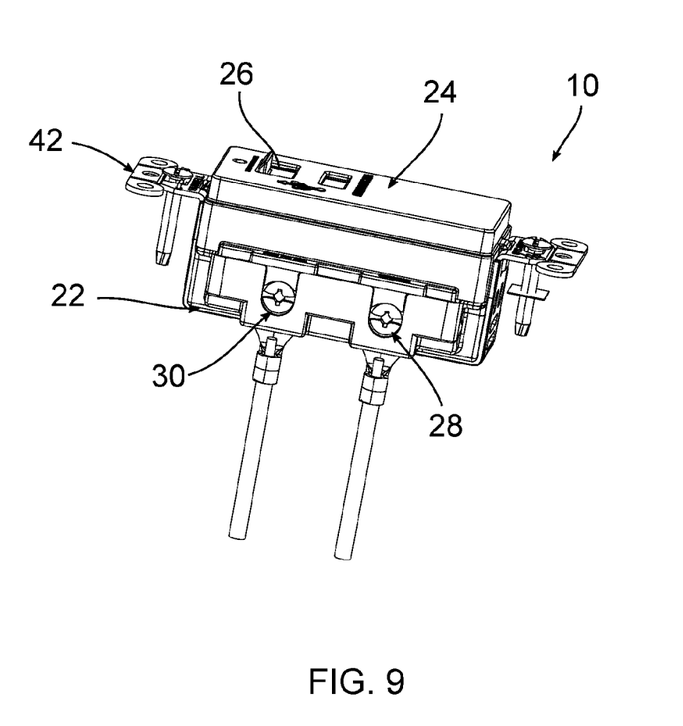
FIG. 9 is a perspective view of the receptacle of FIG. 1 with conductors attached in a second exemplary configuration.

FIG. 7 shows a second pair of neutral apertures 38 for connecting conductors to the neutral terminal 30 and a second pair of phase apertures 40 for connecting conductors to the phase terminal 28. The second pair of neutral and phase apertures 38, 40 face the back surface of the housing 10. Conductors connected to the second pair of neutral and phase apertures 38, 40 will extend in a direction along the depth of the housing 10, as best shown in FIG. 9. The second pair of neutral apertures 38 can receive a line and/or a load conductor. In various alternative embodiments a single second neutral aperture 38 and second phase aperture 40 can extend into the housing 10 and one or more apertures facing this direction may be omitted.

Figure 10:
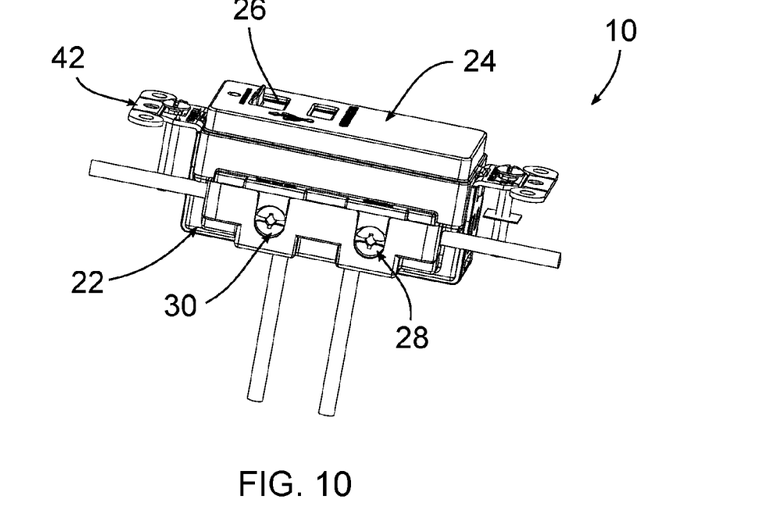
FIG. 10 is a perspective view of the receptacle of FIG. 1 with conductors attached in a third exemplary configuration.

As best shown in FIGS. 8-10, one or more conductors can be connected to the housing 10 in a variety of ways. One or more conductors can be connected to the first apertures 34, 36 as shown in FIG. 8, to the second apertures 38, 40 as shown in FIG. 9, or to both the first and second apertures 34, 36, 38, 40 as shown in FIG. 10. The variety of apertures allows for different line and load wiring configurations so a single receptacle can be used in receptacle boxes having different sizes and shapes. For example, FIG. 8 shows a side wiring configuration, FIG. 9 shows a back wiring configuration using fork connectors attached to the conductors, and FIG. 10 shows a side and back wiring configuration. In an exemplary embodiment, the longitudinal wiring into the first neutral and phase apertures 34, 36 can allow the base 22 of the device to come in contact in a safe way with a metal raceway which cannot be achieved with traditional back wiring.

Figure 11:
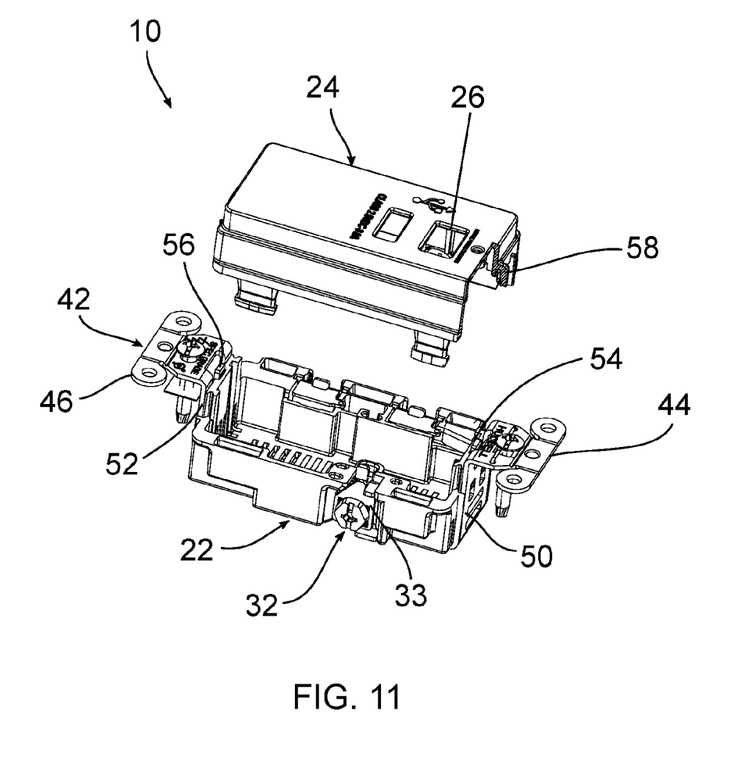
FIG. 11 is a partially exploded view of the receptacle of FIG. 1.
Figure 12:
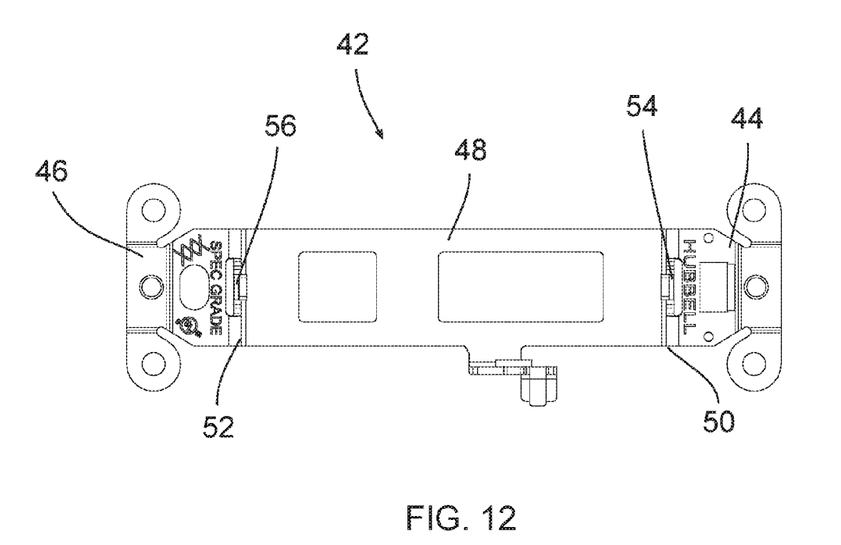
FIG. 12 is a front view of the exemplary mounting strap of the receptacle of FIG. 1.
Figure 13:
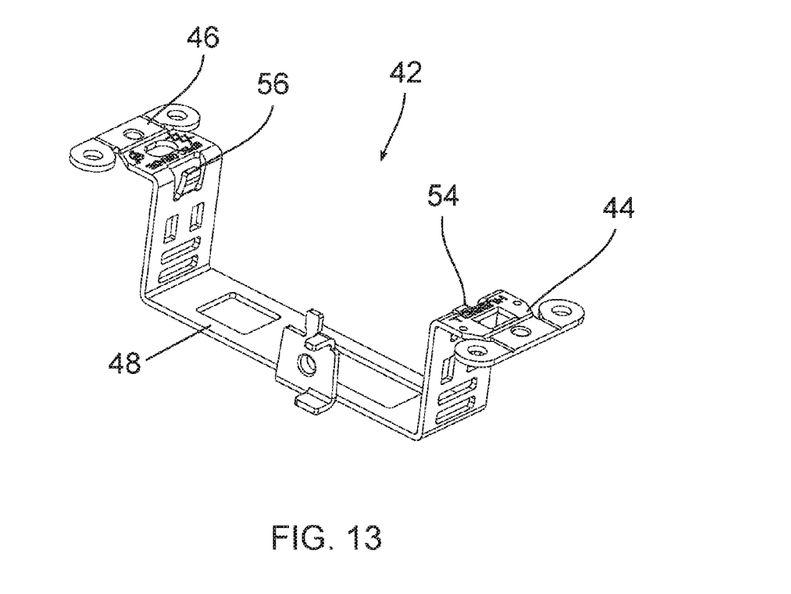
FIG. 13 is a perspective view of the mounting strap of FIG. 12.

The receptacle includes a mounting strap 42 that positions and secures the receptacle in a receptacle box (not shown), for example with fasteners. FIGS. 11-13 show an exemplary embodiment of the mounting strap 42 as single piece, or monolithic, unit having a top flange 44 and a bottom flange 46 extending outwardly from a substantially U-shaped base having a back portion 48, a first end portion 50 and a second end portion 52. The first end portion 50 includes a first tab 54 and the second end portion 52 includes a second tab 56. A set of openings are provided in the back portion 48 and the end portions 50, 52, for example the rectilinear openings as best shown in FIGS. 12 and 13.

Figure 14:
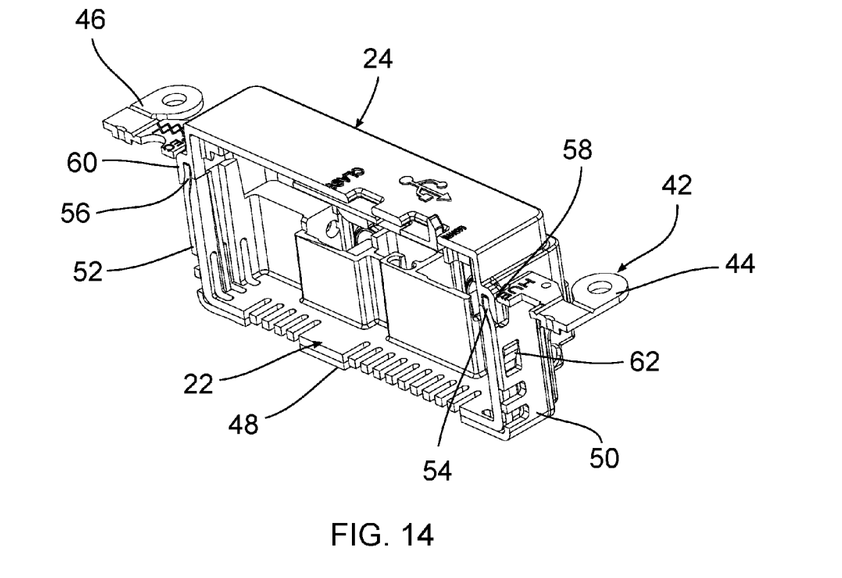
FIG. 14 is a perspective, sectional view of the receptacle of FIG. 1.
Figure 15:
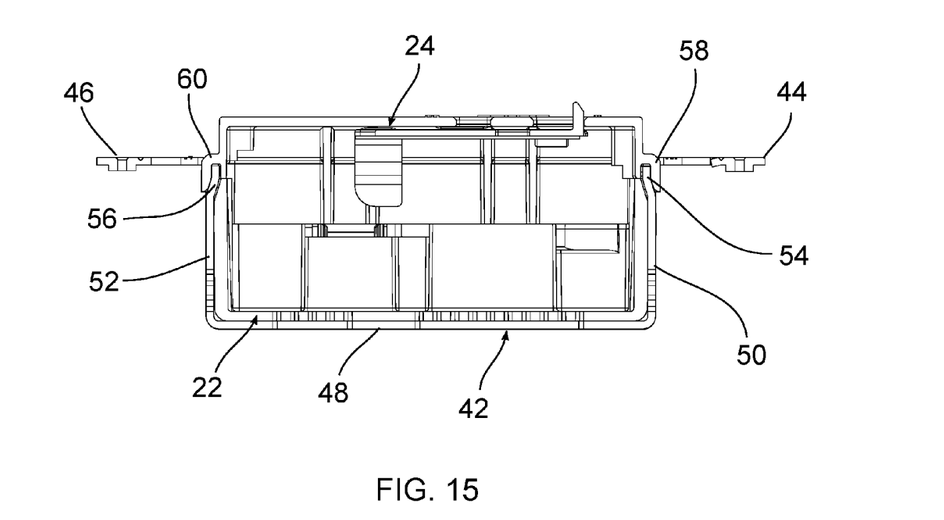
FIG. 15 is a side view of FIG. 14.

In an exemplary embodiment, the mounting strap 42 is connected to the housing 10 without any separate fasteners. For example, the mounting strap 42 can be snap-fit or press-fit to the housing 10. FIGS. 11 and 13 shows the first and second tabs 54, 56 extending from opposite ends of the mounting strap 42, for example at the first and second ends 50, 52 or the top and bottom flanges 44, 46. As best shown in FIGS. 14 and 15, the cover includes a first slot at least partially defined by a first protrusion 58 configured to receive the first tab 54 and a second slot at least partially defined by a second protrusion 60 configured to receive the second tab 56. The first and second protrusions 58, 60 have a curved portion extending from the cover 24, although other configurations can be used.

Figure 16:
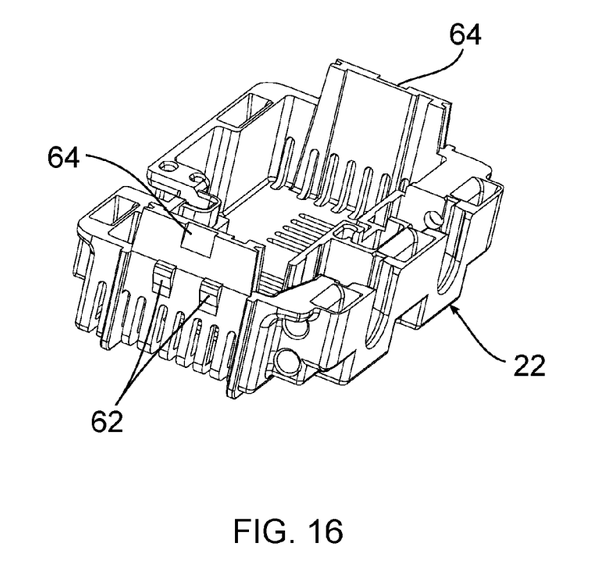
FIG. 16 is a perspective view of the exemplary base of the receptacle of FIG. 1.
Figure 17:
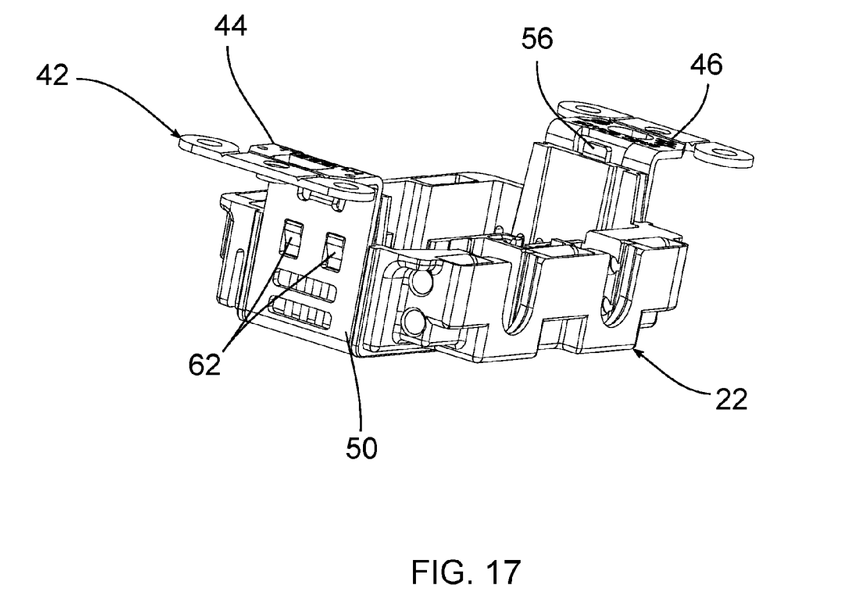
FIG. 17 is a perspective view of the exemplary base and mounting strap of the receptacle of FIG. 1.

The housing 10 can also include one or more projections 62 that can engage or otherwise extend into one or more of the openings in the mounting strap 42. For example, a pair of protrusions can extend from each of the top and bottom edges 16, 18 of the base 22 as best shown in FIGS. 14, 16 and 17. The projections 62 can engage the mounting strap 42, for example extending through the openings in the end portions 50, 52 of the strap 42, to resist dislodgement or movement of the mounting strap 42. In an exemplary embodiment, the projections 62 include an angled side and a substantially flat top surface so that the mounting strap 42 can be placed over the projections 62 and the top surface can engage an edge of the openings, helping to prevent rearward movement of the mounting strap. The base 22 and/or cover 24 can also include one or more depressions or grooves 64, for example an inclined depression, for receiving the tabs 54, 56. Additional tabs and slots can be used to snap-fit the mounting strap to the cover or the base. Other connections may also be used. This way of assembling the mounting strap requires fewer parts and allows the assembly of the unit to be done in a shorter time as well will reduce the device cost.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present application, and are not intended to limit the structure of the exemplary embodiments of the present application to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. An electric receptacle comprising:
a housing having a front surface including a socket opening, a back surface opposite the front surface, a first outer edge, a second outer edge, and a first side extending between the first outer edge and the second outer edge;
a neutral terminal at least partially retained in the housing;
a phase terminal at least partially retained in the housing;
a first neutral opening positioned on the first side, facing the first outer edge, and in communication with the neutral terminal;
a second neutral opening positioned on the first side, facing the back surface, and in communication with the neutral terminal;
a first phase opening positioned on the first side, facing the second outer edge, and in communication with the phase terminal; and
a second phase opening positioned on the first side, facing the back surface, and in communication with the phase terminal.

2. The electric receptacle of claim 1, further comprising a third neutral opening facing the first outer edge and a fourth neutral opening facing the back surface.

3. The electric receptacle of claim 1, further comprising a third phase opening facing the second outer edge and a fourth phase opening facing the back surface.

4. The electric receptacle of claim 1, wherein the housing includes a cover and a base snap-fit to the cover.

5. The electric receptacle of claim 1, wherein the housing includes a USB socket.

6. The electric receptacle of claim 1, wherein the first neutral opening is substantially orthogonal to the second neutral opening, the first phase opening is substantially orthogonal to the second phase opening, and the first neutral opening is substantially opposite the first phase opening.

7. The electric receptacle of claim 1, further comprising a mounting strap snap-fit to the housing.

8. The electric receptacle of claim 7, wherein the mounting strap includes a back portion, a first end portion extending from the back portion, a second end portion extending from the back portion opposite the first end portion, a top flange extending from the first end portion, and a bottom flange extending from the second end portion.

9. The electric receptacle of claim 8, wherein the mounting strap includes a first tab extending from the first end portion and a second tab extending from the second end portion, and the housing includes a first slot receiving the first tab and a second slot receiving the second tab.

10. The electric receptacle of claim 8, wherein the mounting strap includes a first opening in the first end portion and a second opening in the second end portion and the housing includes a first projection extending into the first opening and a second projection extending into the second opening.

11. An electric receptacle comprising:
a housing having a base and a cover connected to the base, the cover having a first socket positioned in a front surface, a first slot positioned in a top edge, and a second slot positioned in a bottom edge;
a neutral terminal at least partially retained in the housing;
a phase terminal at least partially retained in the housing; and
a mounting strap having a back portion, a first end portion extending from the back portion, a second end portion extending from the back portion opposite the first end portion, a top flange extending from the first end portion, a bottom flange extending from the second end portion, a first tab extending from the first end portion into the first slot and a second tab extending from the second end portion into the second slot,
wherein the base includes a first groove defining a first recess receiving the first tab and a second groove defining a second recess receiving the second tab.

12. The electric receptacle of claim 11, wherein the mounting strap includes a first opening in the first end portion and a second opening in the second end portion and the housing includes a first projection extending into the first opening and a second projection extending into the second opening.

13. The electrical receptacle of claim 12, wherein the first projection includes a top surface and an obliquely angled side.

14. The electrical receptacle of claim 11, wherein the first tab extends from a central region of the first end portion and the second tab extends from a central region of the second end portion.

15. The electrical receptacle of claim 11, wherein the first slot is at least partially defined by a protrusion extending from a surface of the cover.

16. The electrical receptacle of claim 11, wherein the housing further comprises a back surface opposite the front surface, a first neutral opening facing the top edge and in communication with the neutral terminal, a second neutral opening facing the back surface and in communication with the neutral terminal, a first phase opening facing the bottom edge and in communication with the phase terminal, and a second phase opening facing the back surface and in communication with the phase terminal.

17. An electric receptacle comprising:
a housing having a front surface including a socket opening, a back surface opposite the front surface, a first outer edge, a second outer edge, a first slot, a second slot, and a first side extending between the first outer edge and the second outer edge, wherein the first side includes a protrusion extending from a major surface of the first side;

a neutral terminal at least partially retained in the housing;

a phase terminal at least partially retained in the housing;

a first neutral opening positioned on the protrusion facing the first outer edge and in communication with the neutral terminal;

a second neutral opening positioned on the protrusion facing the back surface and in communication with the neutral terminal;

a first phase opening positioned on the protrusion facing the second outer edge and in communication with the phase terminal;

a second phase opening positioned on the protrusion facing the back surface and in communication with the phase terminal; and a mounting strap having a back portion, a first end portion extending from the back portion, a second end portion extending from the back portion opposite the first end portion, a top flange extending from the first end portion, a bottom flange extending from the second end portion, a first tab extending from the first end portion into the first slot and a second tab extending from the second end portion into the second slot, wherein the mounting strap is snap-fit to the housing.

18. The electric receptacle of claim 17, wherein the mounting strap includes a first opening in the first end portion and a second opening in the second end portion and the housing includes a first projection extending into the first opening and a second projection extending into the second opening.

19. The electrical receptacle of claim 18, wherein the first projection includes a top surface and an obliquely angled side.

* * * * *